(12) United States Patent
Akiyoshi (10) Patent No.: US 6,950,354 B1
(45) Date of Patent: Sep. 27, 2005

(54) SEMICONDUCTOR MEMORY

(75) Inventor: Hideo Akiyoshi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/012,253

(22) Filed: Dec. 16, 2004

(30) Foreign Application Priority Data

Sep. 6, 2004 (JP) .............................. 2004-258122

(51) Int. Cl.⁷ ............................................. G11C 7/00
(52) U.S. Cl. ..................................... 365/200; 365/210
(58) Field of Search .............................. 365/210, 200, 365/222, 190

(56) References Cited

U.S. PATENT DOCUMENTS 6,009,040 A * 12/1999 Choi et al. .................. 365/233

FOREIGN PATENT DOCUMENTS

JP         2003-036678        2/2003

* cited by examiner

*Primary Examiner*—Son T. Dinh
*Assistant Examiner*—Hien Nguyen
(74) *Attorney, Agent, or Firm*—Arent Fox, PLLC.

(57) ABSTRACT

First dummy memory cells that store first logic and second dummy memory cells that store second logic that is reverse of the first logic are connected to a dummy word line. The first and second dummy memory cells are connected to a dummy bit line. A dummy sense amplifier activates a sense amplifier start signal for a real sense amplifier when the voltage of the dummy bit line varies. When real memory cells are read, the speed at which the first dummy memory cells cause the level of the dummy bit line to vary to the first logic level decreases due to the second logic level stored in the second dummy memory cells. The lower the threshold voltages of transistors, the more obvious this tendency becomes. Thus, the operation start timing of the sense amplifier can be optimally set even if a fabricating condition of a semiconductor memory varies.

12 Claims, 10 Drawing Sheets

SEMICONDUCTOR MEMORY

CROSS REFERENCE TO RELATED APPLICATION

This application is based upon and claims the benefit of priority from Japanese Patent Application No. 2004-258122, filed on Sep. 6, 2004, the entire contents of which are incorporated herein by reference.

BACKGROUND OF THE INVENTION

1. Field of the Invention

The present invention relates to a semiconductor memory such as a static memory, in particular, to a technology for optimally setting driving timing of a sense amplifier.

2. Description of the Related Art

Generally, in a semiconductor memory such as a static memory, a memory cell is selected with a word line signal. Data are read from a selected memory cell to a bit line. A read voltage on the bit line is amplified by a sense amplifier. As a result, data stored in the memory cell are read. Timing at which the sense amplifier starts amplifying the read voltage is set with a sense amplifier start signal. It is preferred that when the read voltage on the bit line can be amplified by the sense amplifier, the sense amplifier start signal is activated. When the timing at which the sense amplifier start signal is activated comes earlier, data cannot be correctly read. In contrast, when the timing at which the sense amplifier start signal is activated delays, the access time is elongated.

To activate the sense amplifier start signal at the optimum timing, a static memory that has a plurality of dummy memory cells that are used to adjust timing (referred to as timing adjustment dummy memory cells) and a plurality of dummy memory cells used to load bit lines (referred to as load dummy memory cells) has been proposed (for example, Japanese Unexamined Patent Application Publication No. 2003-366781). In the static memory, the timing adjustment dummy memory cells are connected to a dummy word line. The gates of transfer transistors of the load dummy memory cells are connected to a ground line. Each of the timing adjustment dummy memory cells and each of the load dummy memory cells store reverse logics and are connected to common complementary bit lines. When each timing adjustment dummy memory cell is driven with the dummy word line, the voltage on each bit line varies without influence of a leakage current that flows from each load dummy memory cell to each bit line. Thus, the sense amplifier start signal is activated at desired timing in accordance with the number of timing adjustment dummy memory cells. On the other hand, when the threshold value of a transistor is low due to fluctuation in a fabricating condition of a semiconductor memory, the drivability of the timing adjustment dummy memory cells improves. Thus, the activation timing of the sense amplifier start signal comes earlier. In contrast, when the threshold voltage of a transistor is high, the activation timing of the sense amplifier start signal delays.

SUMMARY OF THE INVENTION

An object of the present invention is to optimally set the operation start timing of a sense amplifier when a leakage current that flows from a memory cell to a bit line varies due to fluctuation in a fabricating condition of a semiconductor memory.

According to a first aspect of the semiconductor memory of the present invention, a plurality of real memory cells are connected to a real bit line. Each real memory cell has a real latch and a transfer transistor. The real latch stores write data. The transfer transistor is connected to a storage node of the real latch. Each first dummy memory cell has a first latch and a transfer transistor. The first latch stores a first logic. The transfer transistor is connected to a storage node of the first latch. Each second dummy memory cell has a second latch and a transfer transistor. The second latch stores a second logic that is reverse to the first logic. The transfer transistor is connected to a storage node of the second latch. A dummy bit line is connected to the storage nodes of the first and second dummy memory cells through the transfer transistors. A dummy word line is connected to the gates of the transfer transistors of the first and second dummy cells. In response to activation of the dummy word line, a first level corresponding to the first logic is output from each of the first dummy memory cells to the dummy bit line. At this point, a second level corresponding to the second logic is output from each of the second dummy memory cells to the dummy bit line.

When a fabricating condition of a semiconductor memory changes and a threshold voltage (absolute value) of a transfer transistor lowers, a leakage current that flows from a not-accessed real memory cell to a real bit line increases. At this point, it is difficult for an accessed real memory cell to vary the voltage of a real bit line, so that it is necessary to delay the activation timing of the real sense amplifier. According to the present invention, when the threshold voltage of a transfer transistor lowers, the supply of the second level from the second dummy memory cells to the dummy bit line increases. The first and second levels are reverse to each other. Therefore, when the dummy word line is activated, the speed at which the level of the dummy bit line varies to the first level decreases as the threshold voltage lowers. This can elongate time needed for the voltage of the dummy bit line to reach a predetermined value is. As a result, the activation timing of the sense amplifier start signal, which is output from a dummy sense amplifier, can be delayed. With a high operation temperature of the semiconductor memory and an increase of a leakage current from the memory cells to the bit lines, it is possible to delay the activation timing of the sense amplifier start signal as described above. In other words, operation timing of the real sense amplifier can be optimally set in accordance with fluctuation in the fabricating condition and temperature. As a result, the semiconductor memory can be prevented from malfunctioning. Since the timing margin of a real sense amplifier increases, a circuit design can be facilitated. If the timing margin is set almost the same as that in the prior art, the access time can be shortened. This can facilitate designing of a semiconductor memory that operates at high speed.

According to a preferable example of the first aspect of the semiconductor memory of the present invention, a dummy precharging circuit precharges the dummy bit line in high level. The storage node of each of the first dummy memory cells is kept in low level. The storage node of each of the second dummy memory cells is kept in high level. In this example, the level of the dummy bit line is varied from high to low when a real memory cell is accessed. During a low threshold voltage of the transfer transistor, it takes more time for the level of the dummy bit line to change to a low level due to a high level output from each of the second dummy memory cells. Generally, the levels of the precharging voltages of the real bit line and the dummy bit line are high. Thus, the time for designing a semiconductor memory can be shortened by using a conventional precharging circuit.

According to a second aspect of the semiconductor memory of the present invention, a dummy word line is connected only to gates of transfer transistors of the first dummy memory cells, not to the second dummy memory cells. The transfer transistors of the second dummy memory cells are always turned on. The other structure of the second aspect is the same as that of the first aspect. If a voltage corresponding to a second logic, which is stored in a second latch of each of the second dummy memory cells, coincides with a precharging voltage, the same operation as that in the first aspect can be performed even with a storage node of the second latch always connected to a dummy bit line. Since the second dummy memory cells have a function of precharging the dummy bit line, it is able to simplify the configuration of a conventional precharging circuit. In addition, the number of portions to which the dummy word line is connected is decreased, so that a voltage change in the dummy word line can be made sharp. Thus, timing of a circuit can be easily designed.

According to a preferable example of the second aspect of the semiconductor memory of the present invention, the storage node of each of the first dummy memory cells is kept in low level. In contrast, the storage node of each of the second dummy memory cells is kept in high level. Generally, the levels of the precharging voltages of the real bit line and the dummy bit line are high. Thus, the present invention is applicable to a semiconductor memory without a change of the basic logic of the conventional precharging operation. This can shorten the time for designing the semiconductor memory.

According to preferable examples of the first and second aspects of the semiconductor memory of the present invention, each third dummy memory cell has a third latch and a transfer transistor. The third latch stores a second logic. The transfer transistor is connected to a storage node of the third latch. The storage node is connected to the dummy bit line through the transfer transistor that is always turned off. Storing a second logic reverse to the logic of the first dummy memory cells in a third dummy memory cell, one not involved with generation of a sense amplifier start signal, makes it possible to prevent activation timing of the sense amplifier start signal from advancing due to a leakage current flowing from the third dummy memory cells to the dummy bit line.

According to a third aspect of the semiconductor memory of the present invention, each real memory cell is connected to complementary real bit lines. Complementary storage nodes of each first dummy memory cell, which stores a first logic, are connected to complementary dummy bit lines through a pair of transfer transistors. One of the complementary storage nodes of each second dummy memory cell, which stores a second logic, is connected to one of the complementary dummy bit lines through one of the transfer transistors. The other of the complementary storage nodes of each of the second dummy memory cells is non-connected to the other of the complementary dummy bit lines. A dummy word line is connected to gates of the transfer transistors of each of the first and second dummy memory cells. A dummy sense amplifier activates a sense amplifier start signal when a voltage difference between the complementary dummy bit lines has reached a predetermined value due to the activation of the dummy word line. In a case that the complementary storage nodes of the second dummy memory cell, which stores a logic reverse to that of the first memory cells, are connected to the complementary dummy bit lines, the voltage difference between the complementary dummy bit lines occurring due to the first dummy memory cells is too small to generate the sense amplifier start signal at a desired timing. In case of a differential type dummy sense amplifier, it is preventable that the other of the complementary dummy bit lines is affected by a stored value of the second dummy memory cell, by non-connecting the other of the complementary storage nodes of the second dummy memory cell to the other of the complementary dummy bit lines. As a result, the sense amplifier start signal can be generated at a desired timing.

According to a preferable example of the semiconductor memory of the present invention, the dummy precharging circuit precharges the complementary dummy bit lines in a high level. In each of the first dummy memory cells, one of the complementary storage nodes corresponding to one of complementary dummy bit lines is kept in a low level and the other of the complementary storage nodes corresponding to the other of complementary dummy bit lines is kept in a high level. In each of the second dummy memory cells, one of the complementary storage nodes corresponding to one of complementary dummy bit lines is kept in a high level and the other of the complementary storage nodes corresponding to the other of complementary dummy bit lines is kept in a low level. In this example as in the first aspect, it is possible to shorten the time for designing a semiconductor memory by use of the conventional precharging circuit.

According to a fourth aspect of the semiconductor memory of the present invention, a dummy word line is connected only to gates of transfer transistors of each first dummy memory cell, not to those of each second dummy memory cell. The transfer transistors of the second dummy memory cells are always turned on. The rest of the structure of the fourth aspect is the same as that of the third aspect. According to the fourth aspect as according to the third aspect, it is preventable that the other of the complementary dummy bit lines is affected by a stored value of each of the second dummy memory cells. As a result, the sense amplifier start signal can be generated at a desired timing.

According to a preferable example of the fourth aspect of the semiconductor memory of the present invention, in each of the first dummy memory cells, one of the complementary storage nodes corresponding to one of complementary dummy bit lines is kept in a low level and the other of the complementary storage nodes corresponding to the other of complementary dummy bit lines is kept in a high level. In each of the second dummy memory cells, one of the complementary storage nodes corresponding to one of the complementary dummy bit lines is kept in a high level and the other of the complementary storage nodes corresponding to the other of complementary dummy bit lines is kept in a low level. In this example as in the second aspect, the present invention is applicable to a semiconductor memory without a change of the basic logic of the conventional precharging operation. As a result, it is possible to shorten the time for designing a semiconductor memory.

According to preferable examples of the third and fourth aspects of the semiconductor memory of the present invention, each third dummy memory cell has a third latch and a pair of transfer transistors. The third latch stores the second logic. The pair of transfer transistors are connected to complementary storage nodes of the third latch, respectively. The complementary storage nodes are connected to the complementary dummy bit lines through the transfer transistors that are always turned off. In this example as in the first and second aspects, it is able to prevent the activation timing of the sense amplifier start signal from advancing due to a leakage current flowing from the third dummy memory cells to the complementary dummy bit lines.

BRIEF DESCRIPTION OF DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

The present invention is made to solve the following problem. When fluctuation in a fabricating condition of a semiconductor memory causes the threshold voltage of a transistor to decrease or during a high operation temperature thereof a leakage current that flows from a memory cell (real memory cell) storing write data to a bit line (real bit line) increases. The leakage current prevents the voltages between a pair of bit lines from being largely different from each other. Thus, while a large leakage current flows from a memory cell to a bit line, it is necessary to delay generation timing of a sense amplifier start signal. The sense amplifier should start operating after the voltage difference between the pair of bit lines becomes sufficiently large.

Next, with reference to the accompanying drawings, embodiments of the present invention will be described. In these drawings, double circles represent external terminals. In these drawings, each of signal lines denoted by solid lines is composed of a plurality of lines. A part of a block to which a solid line is connected is composed of a plurality of circuits. A signal supplied through an external terminal is represented by the same letters as the terminal name. In addition, a signal line through which a signal is transferred is represented by the same letters as the signal name.

First Embodiment

Figure 1:
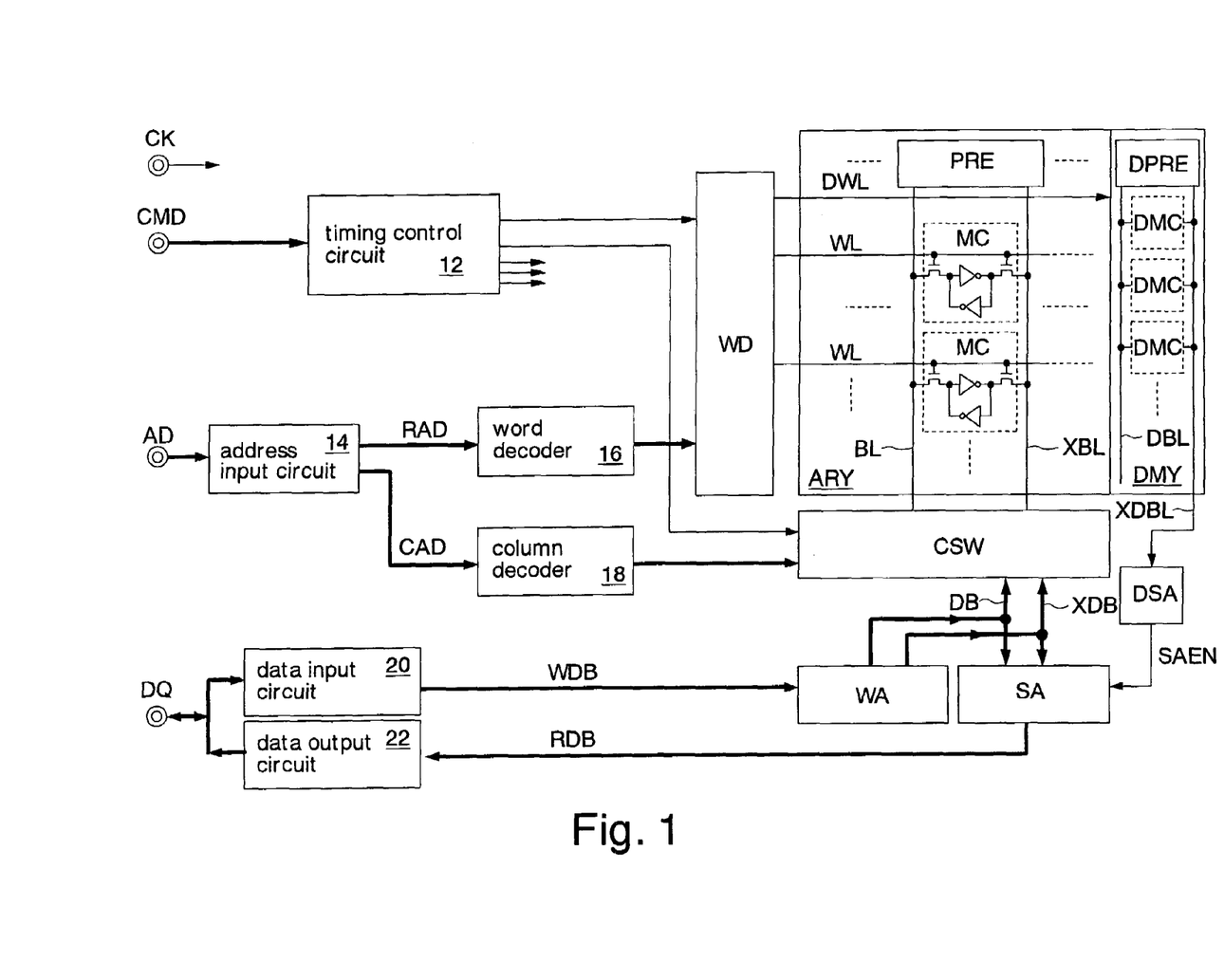
FIG. 1 is a block diagram showing a first embodiment of the semiconductor memory of the present invention.

FIG. 1 shows a first embodiment of the semiconductor memory of the present invention. The semiconductor memory is composed of a clock synchronous type static random access memory (hereinafter referred to as SRAM) fabricated by a CMOS process on a silicon substrate. The SRAM is designed as a macro mounted on for example a system LSI or the like. The SRAM has a timing control circuit 12, an address input circuit 14, a word decoder 16, a column decoder 18, a data input circuit 20, a data output circuit 22, a word driver WD, a memory cell array ARY, a dummy area DMY, a column switch CSW, a write amplifier WA, a sense amplifier SA, and a dummy sense amplifier DSA. A clock signal received from a clock terminal CK is supplied to each circuit of the SRAM.

The timing control circuit 12 interprets a command signal CMD received through a command terminal CMD. The command signal CMD includes for example a chip select signal, a write enable signal, and an output enable signal. The timing control circuit 12 generates a plurality of timing signals that cause the SRAM to operate in accordance with an interpreted command. The timing signals are outputs to the word driver WD, the column switch CSW, and other circuits that require operation timing.

The address input circuit 14 receives an address signal AD through an address terminal AD and outputs the received signal as a row address signal RAD and a column address signal CAD to the word decoder 16 and the column decoder 18, respectively. The row address signal RAD is used to select a word line WL that will be described later. The column address signal CAD is used to select a column switch CSW that will be described later. The word decoder 16 outputs a decoded signal of the row address signal RAD to the word driver WD. The column decoder 18 outputs a decoded signal of the column address signal CAS to the column switch CSW.

The data input circuit 20 receives the write data through a data terminal DQ and outputs the received data to a write data bus WDB. The data output circuit 22 receives data from a memory cell MC through a data bus RDB. The data output circuit 22 outputs the received data to the data terminal DQ. The data terminal DQ is composed of for example 16 bits.

The word driver WD operates in synchronization with a timing signal. The word driver WD activates one of the word lines WL in a predetermined period in the high level in accordance with a decoded signal received from the word decoder 16. In addition, the word driver WD activates a dummy word line DWL in a predetermined period in the high level in synchronization with a timing signal. In this example, the activation timing of the dummy word line DWL is the same as the activation timing of each word line WL.

The memory cell array ARY has a plurality of static memory cells MC (real memory cells) and a precharging circuit PRE. Each of the memory cells MC has a pair of latches that are inverters (real latch) that store write data and a pair of transfer transistors (nMOS transistors) whose first terminals are connected to complementary storage nodes of the latches (output nodes of the inverters). The second terminals of the transfer transistors are connected to complementary bit line BL and XBL (real bit lines), respectively. Rows of memory cells MC arranged in the horizontal direction of the drawing are connected to a common word line WL. On the other hand, columns of memory cells arranged in the vertical direction of the drawing are connected to common bit lines BL and XBL. Columns of memory cells MC arranged in the vertical direction and a precharging circuit PRE are arranged in the horizontal direction of the drawing. Each precharging circuit precharges complementary bit lines BL and XBL in the high level (for example, at the power supply voltage VDD) while a corresponding memory cell MC is not being accessed.

The dummy area DMY is disposed adjacent to the memory cell array ARY. The dummy area DMY has dummy memory cells DMC and a dummy precharging circuit DPRE. One column of dummy memory cells DMC is arranged in the vertical direction of the drawing. The dummy memory cells DMC are connected to common complementary dummy bit lines DBL and XDBL. Each of the dummy memory cells DMC has the same structure as each of the memory cells MC. The dummy memory cells DMC and the dummy bit lines DBL and XDBL are arranged at the same pitches as the memory cells MC and the bit lines BL and XBL. Thus, when the SRAM is fabricated, the dummy memory cells DMC and the dummy bit lines DBL and XDBL function as shape dummies used to form the memory cells MC at edges of the memory cell array ARY in a correct shape. While a memory cell MC is not being accessed, the dummy precharging circuit DPRE precharges the complementary dummy bit lines DBL and XDBL in the high level (for example, at the power supply voltage VDD). The dummy area DMY will be described in detail with reference to FIG. 2.

A column switch CSW is disposed corresponding to a pair of bit lines BL and XBL. Each column switch CSW is composed of for example an nMOS transistor and a pMOS transistor. 16 lines of bit lines BL and XBL (corresponding to the number of bits of the terminal DQ) are connected to complementary data buses DB and XDB. When the data writing operation is performed, the write amplifier WA amplifies the signal amount of the write data on the write data bus WDB and outputs the amplified write data to the data buses DB and XDB. When the data reading operation is performed, while a sense amplifier enable signal SAEN is activated, the sense amplifier SA (real sense amplifier) amplifies the voltages of bit lines BL and XBL connected to the complementary data bus lines DB and XDB. More specifically, the sense amplifier SA amplifies the voltage difference between a pair of bit lines BL and XBL and outputs the amplified signal to the data bus RDB. The dummy sense amplifier DSA generates the sense amplifier enable signal SAEN (sense amplification start signal) in accordance with the voltage on the dummy bit line XDBL. The detail of the dummy area DMY will be described in detail with reference to FIG. 2. The sense amplifier enable signal SAEN may be supplied to the timing control circuit 12. In the timing control circuit 12, a timing signal with which the sense amplifier SA is operated may be generated.

Figure 2:
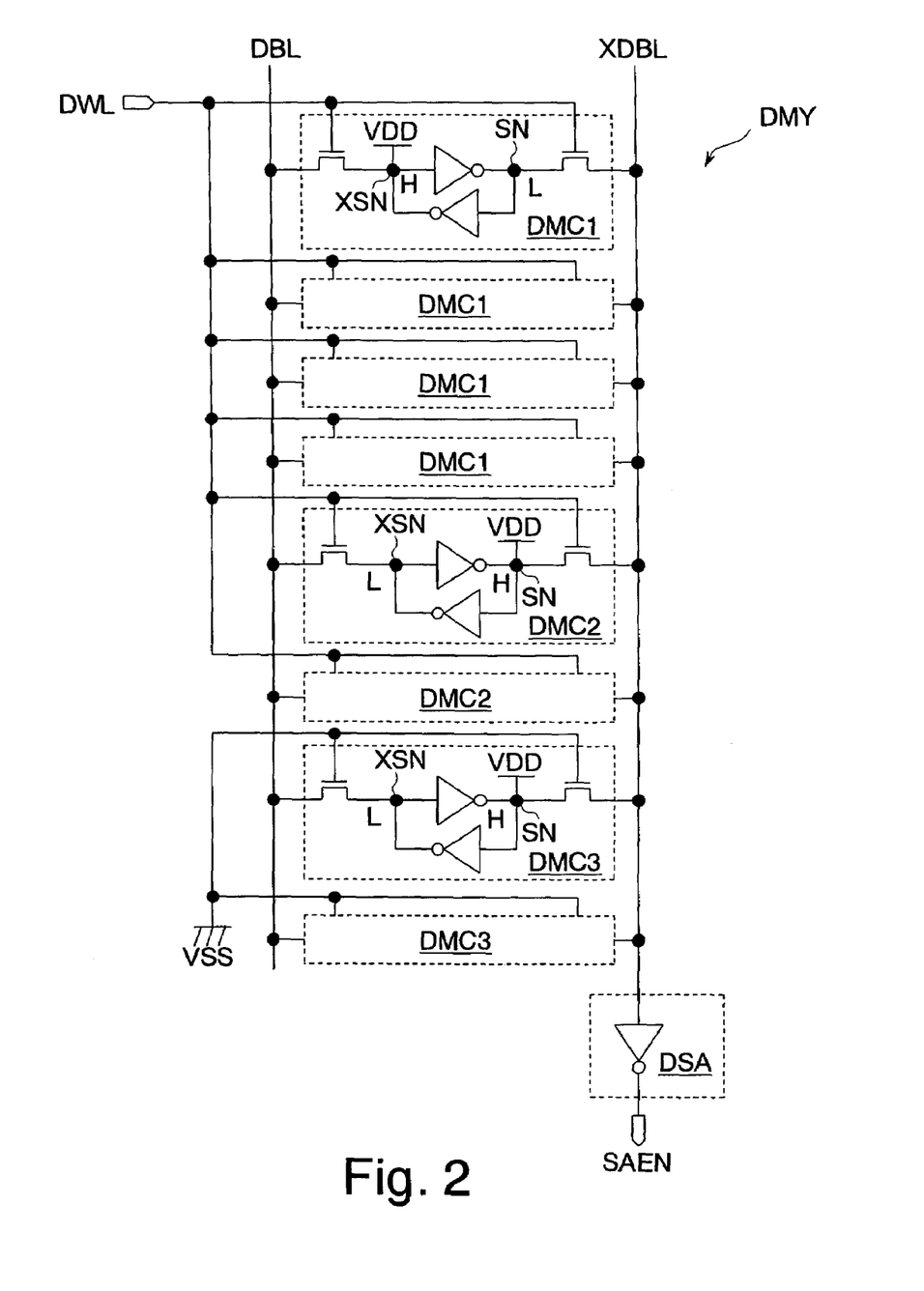
FIG. 2 is a circuit diagram showing details of a dummy area of the first embodiment.

FIG. 2 shows details of the dummy area DMY of the first embodiment. The dummy area DMY has four dummy memory cells DMC1 (first dummy memory cells) that are kept in the low level (first logic), two dummy memory cells DMC2 (second dummy memory cells) that are kept in the high level (second logic), and a plurality of dummy memory cells DMC3 (third dummy memory cells) that are kept in the high level (second logic). In the example, the logic level of each storage node SN on the dummy bit line XDBL side is defined as the logic level of each of the dummy memory cells DMC1 to DMC3. The numbers of dummy memory cells DMC1 to DMC3 are not limited to those of the foregoing example as long as the sense amplifier enable signal SAEN can be activated at optimum timing.

Each of the dummy memory cells DMC1 to DMC3 has a pair of latches that are inverters and a pair of transfer transistors (nMOS transistors) whose first terminals are connected to complementary storage nodes SN and XSN of the latches (output nodes of the inverters). The latches of the dummy memory cells DMC1 to DMC3 are referred to as first latches, second latches, and third latches, respectively. First terminals of the transfer transistors of each of the dummy memory cells DMC1 to DMC3 are connected to the storage node SN or XSN of the latches. Second terminals of the transfer transistors are connected to the complementary dummy bit line DBL or XDBL. The total number of the dummy memory cells DMC1 to DMC3 is equal to the number of memory cells MC connected to a pair of the bit lines BL and XBL.

In each of the dummy memory cells DMC1, the storage node XSN on the dummy bit line DBL side is connected to the power supply line VDD. In each of the dummy memory cells DMC2 and DMC3, the storage node on the dummy bit line XDBL side is connected to the power supply line VDD. In each of the dummy memory cells DMC1 and DMC2, the gate of each transfer transistor is connected to the dummy word line DWL. Thus, in each of the dummy memory cells DMC1 and DMC2, the storage nodes SN and XSN are connected to the complementary dummy bit lines DBL and XDBL (or XDBL and DBL), respectively, while the dummy word line DWL is activated. In each of the dummy memory cells DMC3, the gates of the transfer transistors are connected to a ground line VSS. Thus, in each of the dummy memory cells DMC3, always the storage nodes SN and XSN are non-connected to the dummy bit lines DBL and XDBL.

The dummy sense amplifier DSA has a CMOS inverter whose input is connected to the dummy bit line XDBL. The dummy sense amplifier DSA activates the sense amplifier enable signal SAEN in the high level a predetermined period after the dummy word line DWL has been activated. More specifically, when the dummy word line DWL is activated, the storage node SN of each of the dummy memory cells DMC1 and DMC2 is connected to the dummy bit line XDBL that has been precharged in the high level. Electric charges on the dummy bit line XDBL are extracted by each of the dummy memory cells DMC1. In addition, electric charges are supplied from each of the dummy memory cells DMC2 to the dummy bit line DBL. The voltage of the dummy bit line XDBL gradually lowers. When the voltage of the dummy bit line XDBL is lower than the threshold voltage of the inverter of the dummy sense amplifier DSA, the sense amplifier enable signal SAEN is activated. The numbers of dummy memory cells DMC1 and DMC2 are designed so that the sense amplifier enable signal SAEN is activated at desired timing in a standard state (the threshold voltage of each transfer transistor is normal and the operation temperature is normal). The desired timing represents timing at which the voltage difference between a pair of bit lines BL and XBL is to be a value of which data stored in a memory cell MC can be correctly read.

Because of fluctuation in the fabricating condition of the SRAM, if the threshold voltage of the nMOS transistors is low, "on" currents of transfer transistors of a memory cell MC (real memory cell) that is accessed increase. In addition, leakage currents that flow in the transfer transistors of each memory cell MC that is not accessed also increase. Voltages of the bit lines BL and XBL (real bit lines) are affected and varied by the "on" currents and the leakage currents. The fabricating condition includes an ion implementation amount, an exposure condition, a film thickness, and so forth.

According to the present invention, the increases of the "on" currents can be compensated by the dummy memory cells DMC1. In addition, the increases of the leakage currents can be compensated by the dummy memory cells DMC2. Thus, timing at which the sense amplifier SA starts amplifying voltages can be automatically and optimally set when the threshold voltages of transistors vary. This operation applies to the case that the operation temperature of the SRAM is high. In this case, the sense amplifier SA can be prevented from malfunctioning when the fabricating condition fluctuates and the operation temperature varies. In other words, the yield of the fabrication of the SRAM can be improved.

Figure 3:
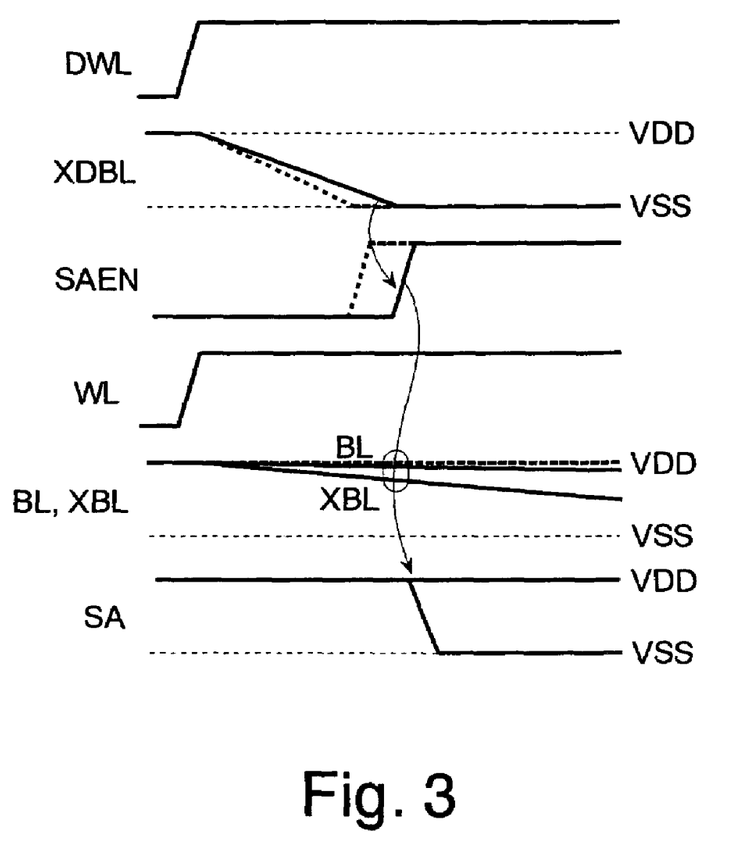
FIG. 3 is a timing chart showing an operation of the first embodiment.

FIG. 3 shows the operation of the first embodiment. FIG. 3 shows the reading operation of the SRAM until the sense amplifier SA starts the amplifying operation. Before the reading operation is started, bit lines BL and XBL and dummy bit lines DBL and XDBL are precharged at power supply voltage VDD. Next, a read command is supplied to a command terminal CMD. A word line WL is activated in accordance with an address signal AD. In addition, the dummy word line DWL is activated. As the dummy word line DWL is activated, the dummy memory cells DMC1 and DMC2 are connected to the dummy bit line XDBL. As a result, the voltage of the dummy bit line XDBL lowers. When the voltage of the dummy bit line XDBL reaches a predetermined value, the sense amplifier enable signal SAEN is activated. As the sense amplifier enable signal SAEN is activated, the sense amplifier SA starts amplifying the voltage difference between the bit lines BL and XBL. In other words, the reading operation is executed.

In this case, as described above, when the threshold voltage of the nMOS transistors is low or the operation temperature is high, the voltage drop speed of the dummy bit line XDBL decreases. In the drawing, curves denoted by solid lines represent signals in the case that the threshold voltage is low or the operation temperature is high. In contrast, in the drawing, curves denoted by dotted lines represent signals in the case that the threshold voltage is normal or the operation temperature is normal. When the threshold voltage is low or the operation temperature is high, leakage currents that flow from memory cells MC that are not accessed to bit lines BL and XBL increase. Thus, the voltage of a bit line (for example, BL) that has been precharged at the power supply voltage VDD lowers. As a result, it takes a long time until the voltage difference between the bit lines BL and XBL reaches a predetermined value. However, according to the present invention, after the voltage difference between the bit lines BL and XBL is a predetermined value, the sense amplifier enable signal SAEN can be activated. On the other hand, in the conventional SRAM, even if the threshold voltage is low, since the voltage drop speed of the dummy bit line XDBL does not decrease, the activation timing of the sense amplifier enable signal SAEN does not delay.

According to the first embodiment, the activation timing of the sense amplifier enable signal SAEN can be always optimally set when the threshold voltage of transistors and the operation temperature vary. Thus, the sense amplifier SA can be prevented from malfunctioning, and so can the SRAM. Since the timing margin of the sense amplifier SA increases, a circuit can be easily designed. When the timing margin does not need to be increased, the access time can be shortened. In other words, a semiconductor memory that operates at high speed can be designed.

Each of the dummy memory cells DMC1 is kept in the low level. Thus, when the dummy word line DWL is activated, the signal level of the dummy bit line XDBL is varied from the high level (=VDD) to the low level. Thus, the conventional dummy precharging circuit DPRE that precharges the dummy bit line XDBL at the power supply voltage VDD before performing the reading operation can be used. As a result, the design time for the SRAM can be shortened.

Each of the dummy memory cells DMC3 that do not generate the sense amplifier enable signal SAEN is kept in the reverse level of each of the dummy memory cells DMC1. In other words, each of the dummy memory cells DMC3 stores a high level voltage (=VDD) that is the same as the precharging voltage. Thus, leakage currents can be prevented from flowing from the dummy bit line XDBL to the dummy memory cells DMC3. As a result, the activation timing of the sense amplifier enable signal SAEN can be prevented from advancing.

Second Embodiment

Figure 4:
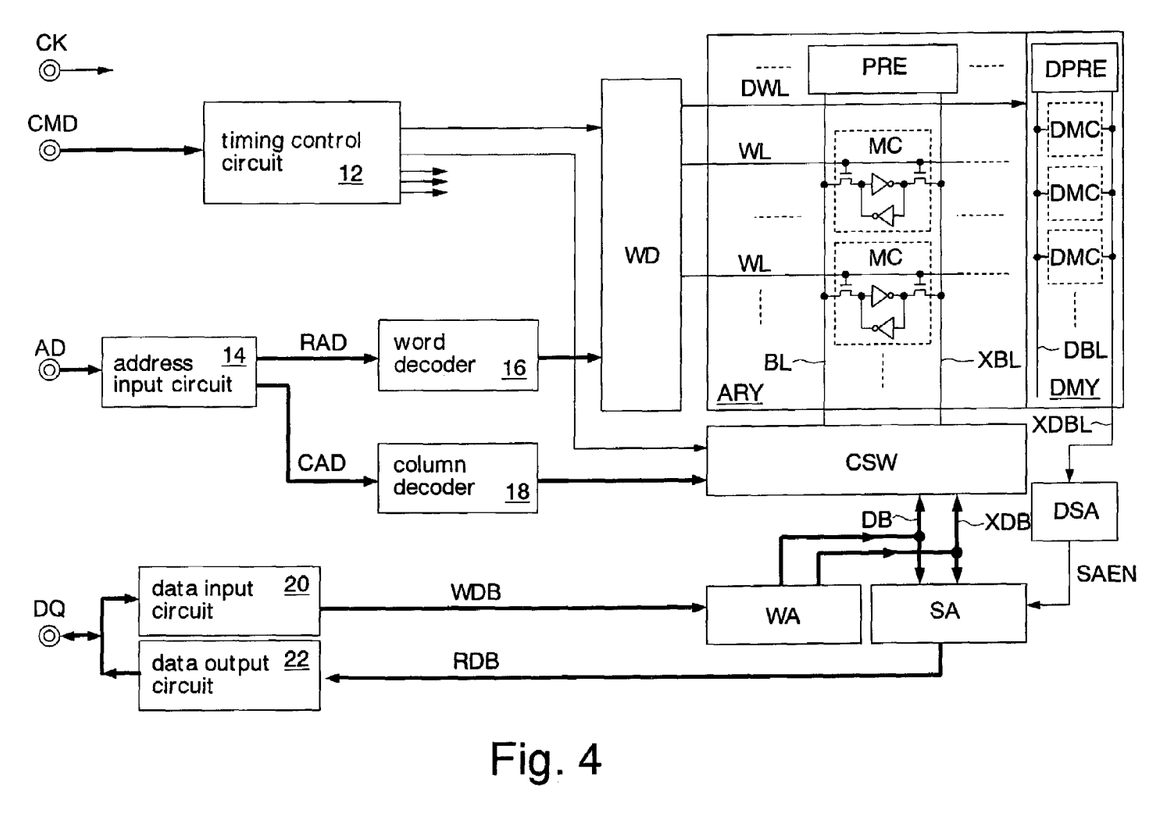
FIG. 4 is a block diagram showing a second embodiment of the semiconductor memory of the present invention.

FIG. 4 shows a second embodiment of the semiconductor memory of the present invention. In FIG. 4, similar portions to those in the first embodiment are denoted by similar reference numerals and their detailed description will be omitted. The structure of the second embodiment is different from the structure of the first embodiment in a dummy area DMY. In other words, the semiconductor memory is formed as an SRAM by a CMOS process on a silicon substrate. The SRAM is designed as a macro mounted on for example a system LSI or the like.

Figure 5:
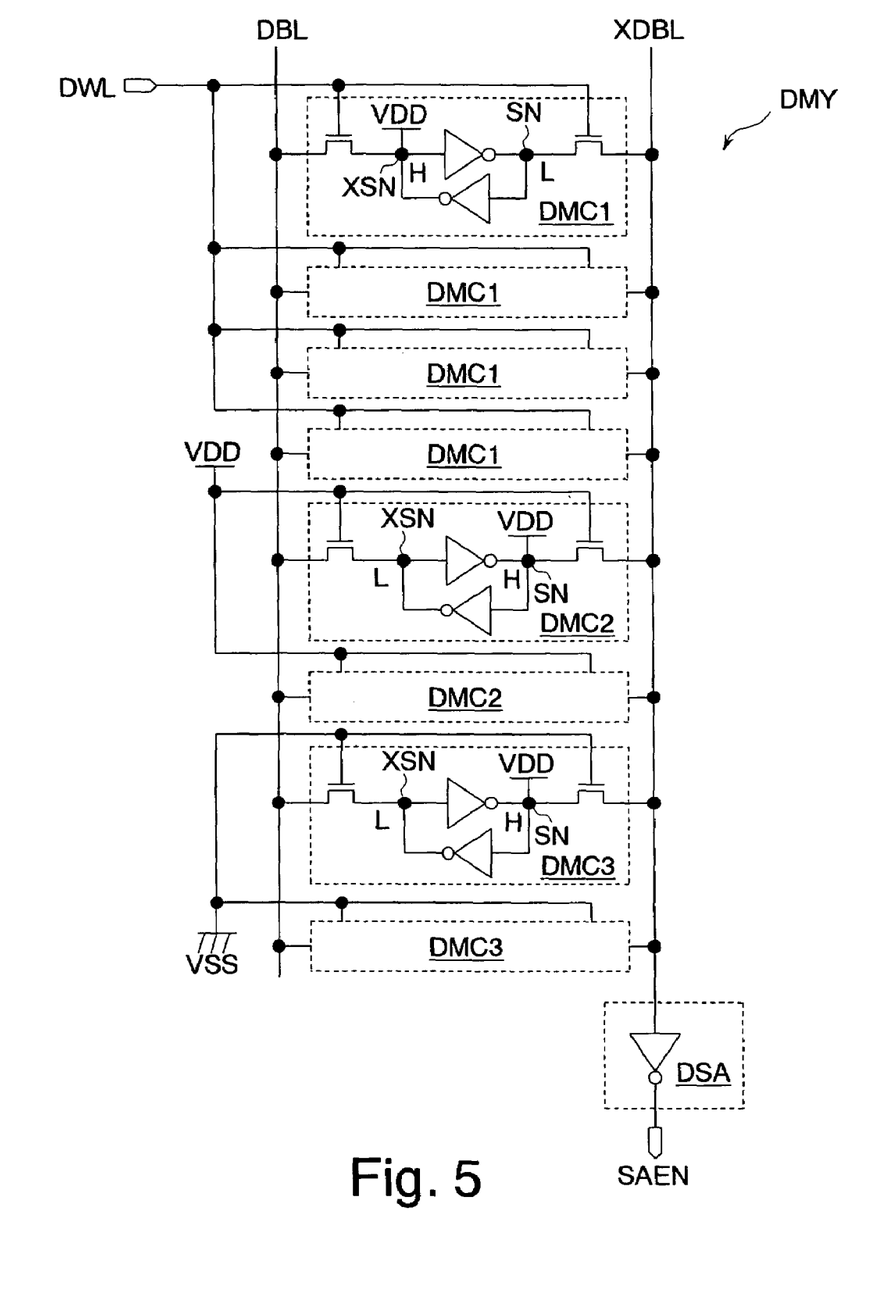
FIG. 5 is a circuit diagram showing details of a dummy area of the second embodiment.

FIG. 5 shows details of a dummy area DMY of the second embodiment. The dummy area DMY of the second embodiment is the same as the dummy area DMY of the first embodiment except that a gate of each transfer transistor of each dummy memory cell DMC2 is connected to a power supply line VDD. A storage node SN of each dummy memory cell DMC2 is kept at a power supply voltage VDD. A precharging voltage of a dummy bit line XDBL is the power supply voltage VDD. Thus, even if each dummy memory cell DMC2 is always connected to the dummy bit line XDBL, the operation of the SRAM is not adversely affected. A dummy bit line DBL is not used to generate a sense amplifier enable signal SAEN. Thus, each dummy memory cell DMC2 can be always connected to the dummy bit line DBL without any problem. Since each dummy memory cell DMC2 can precharge the dummy bit line XDBL at the power supply voltage VDD, the dummy precharging circuit DPRE of the first embodiment can be simplified. In reality, transistors that compose the dummy precharging circuit DPRE can be decreased. The reading operation of the SRAM of the second embodiment is the same as that of the first embodiment (FIG. 3).

According to the second embodiment, the same effect as the first embodiment can be obtained. In addition, according to the second embodiment, the gate of each transfer transistor of each dummy memory cell DMC2 is connected to the power supply line VDD. Thus, each dummy memory cell DMC2 can operate as the precharging circuit for the dummy bit line XDBL. Consequently, the dummy precharging circuit DPRE of the first embodiment can be simplified. In addition, since the number of portions to which the dummy word line DWL is connected is decreased, the voltage of the dummy word line DWL can sharply vary. Thus, timing of a circuit can be easily designed. Each dummy memory cell DMC2 stores the high level. As a result, the present invention can be applied to a semiconductor memory without need to change the basic theory of the conventional precharging operation. Thus, the design time for the SRAM can be shortened.

Third Embodiment

Figure 6:
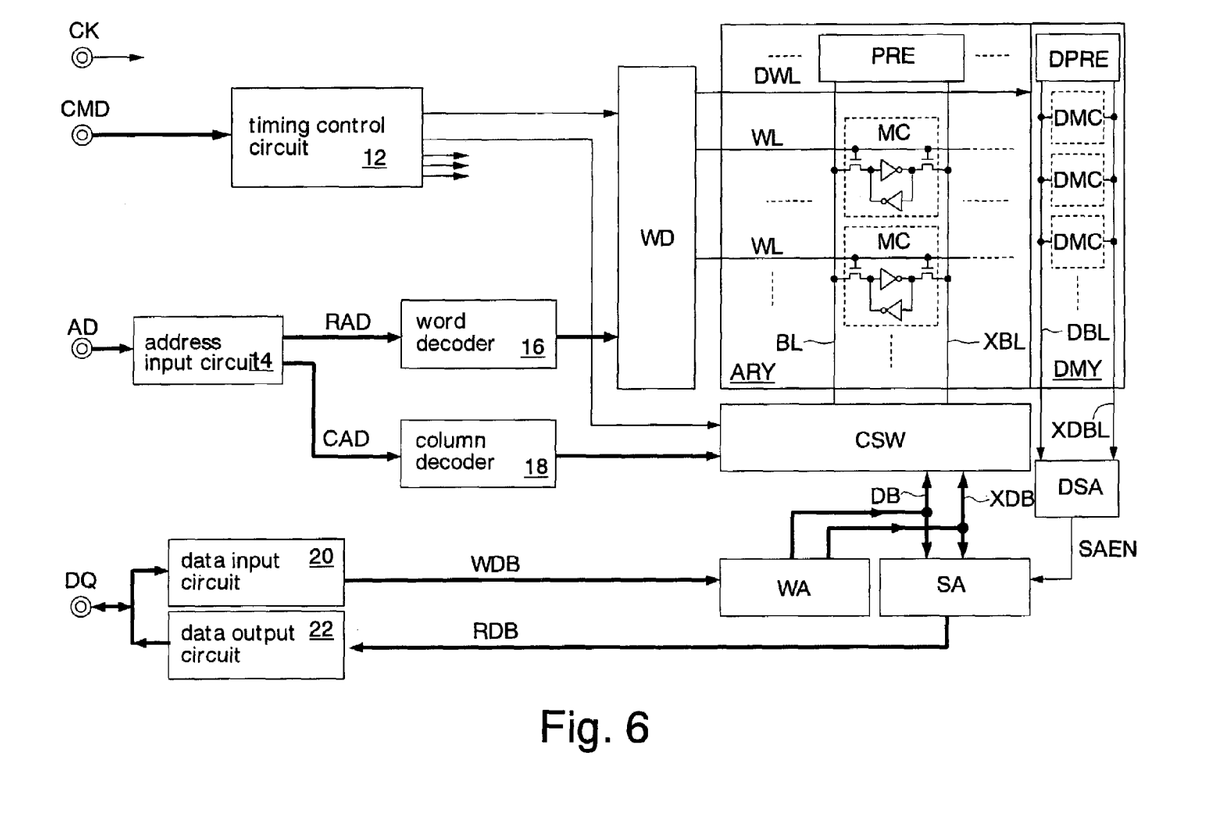
FIG. 6 is a block diagram showing a third embodiment of the semiconductor memory of the present invention.

FIG. 6 shows a third embodiment of the semiconductor memory of the present invention. In FIG. 6, similar portions to those in the first embodiment are denoted by similar reference numerals and their detailed description will be omitted. The third embodiment is different from the first embodiment in a dummy area DMY. In addition, according to the third embodiment, a differential amplification type dummy sense amplifier DSA is used. The dummy sense amplifier DSA amplifies a voltage difference between complementary dummy bit lines DBL and XDBL so as to generate a sense amplifier enable signal SAEN. The other structure of the third embodiment is the same as the structure of the first embodiment. In other words, the semiconductor memory is formed as an SRAM by a CMOS process on a silicon substrate. The SRAM is designed as a macro mounted on for example a system LSI or the like.

Figure 7:
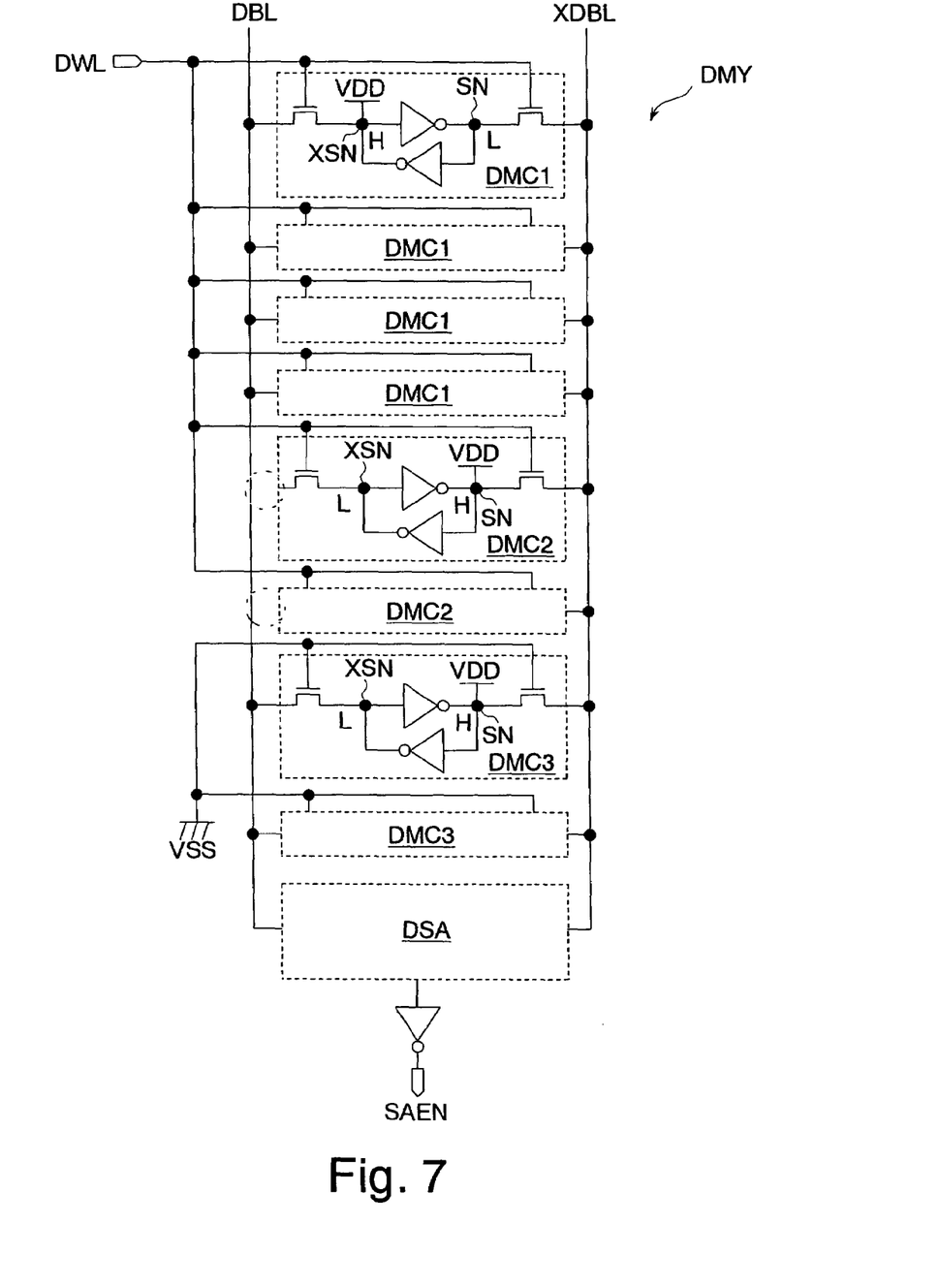
FIG. 7 is a circuit diagram showing details of a dummy area of the third embodiment.

FIG. 7 shows details of the dummy area DMY of the third embodiment. In each dummy memory cell DMC2 of the dummy area DMY, a first terminal of a transfer transistor is connected to a storage node XSN, while a second terminal thereof is not connected to a dummy bit line DBL, but open (denoted by a dotted circle in the drawing). Complementary dummy bit lines DBL and XDBL are connected to a dummy sense amplifier DSA. The other structure of the dummy area DMA of the third embodiment is the same as the structure of the dummy area DMA of the first embodiment (FIG. 2). As each dummy memory cell DMC2 is disconnected from the dummy bit line DBL, the voltage of the dummy bit line DBL that is precharged at the power supply voltage VDD can be prevented from lowering when the dummy word line DWL is activated.

Figure 8:
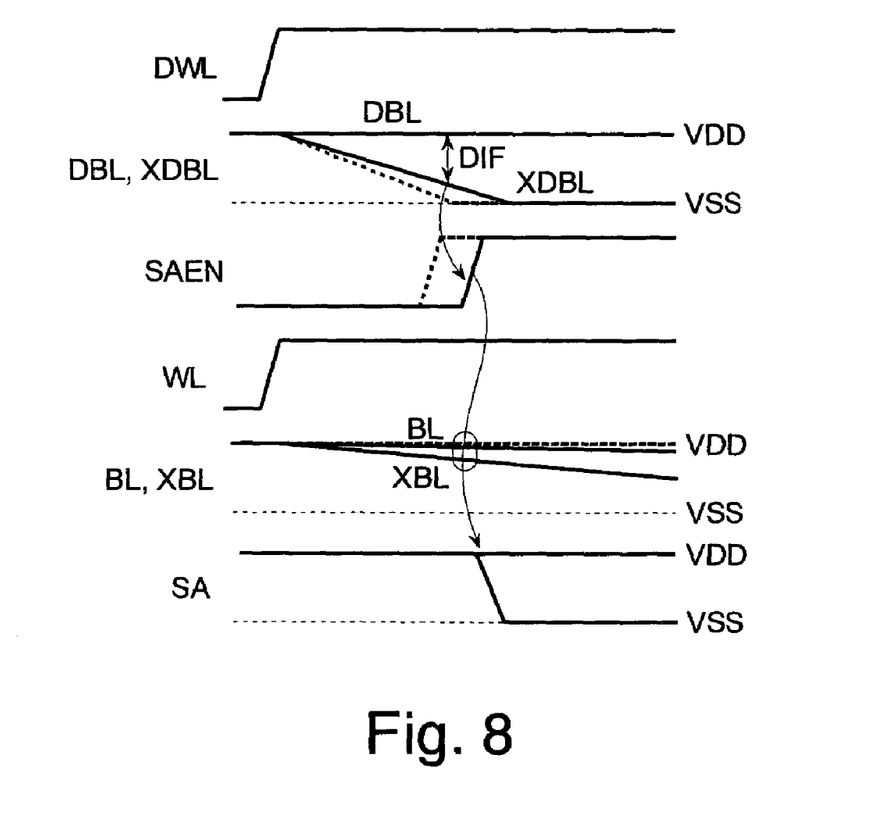
FIG. 8 is a timing chart showing an operation of the third embodiment.

FIG. 8 shows the operation of the third embodiment. FIG. 8 shows the reading operation of the SRAM until the sense amplifier SA starts amplifying voltages.

According to the third embodiment, when a voltage difference DIF between the complementary dummy bit lines DBL and XDBL exceeds a predetermined value, the dummy sense amplifier DSA activates the sense amplifier enable signal SAEN. The other operation of the third embodiment is the same as the operation of the first embodiment (FIG. 3). In the drawing, curves denoted by solid lines represent signals in the case that the threshold voltage is low or the operation temperature is high. In contrast, in the drawing, curves denoted by dotted lines represent signals in the case that the threshold voltage is normal or the operation temperature is normal. According to the third embodiment, since each dummy memory cell DMC2 is disconnected from the dummy bit line DBL, the dummy bit line DBL is kept at the power supply voltage VDD after the dummy word line DWL is activated. Thus, the voltage difference DIF can be securely generated.

Thus, according to the third embodiment, the same effect as the first embodiment can be obtained. In addition, the present invention can be easily applied to the SRAM that generates the sense amplifier enable signal SAEN with the voltage difference between the complementary dummy bit lines DBL and XDBL. At that point, as each dummy memory cell DMC2 is separated from the dummy bit line DBL, the dummy bit line DBL can be prevented from being affected by a stored value of each dummy memory cell DMC2. As a result, the sense amplifier enable signal SAEN can be activated at correct timing.

Fourth Embodiment

Figure 9:
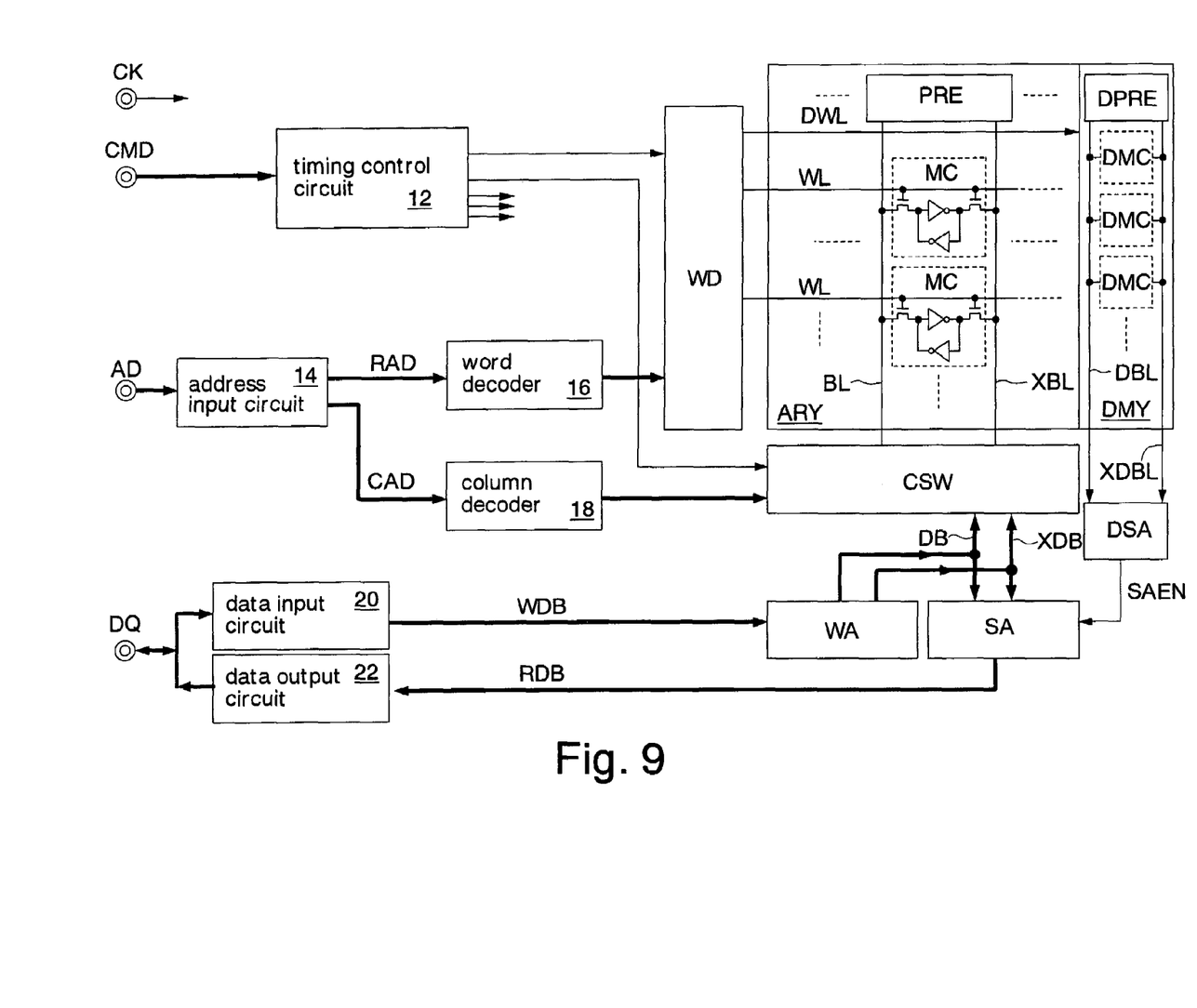
FIG. 9 is a block diagram showing a fourth embodiment of the semiconductor memory of the present invention.

FIG. 9 shows a fourth embodiment of the semiconductor memory of the present invention. In FIG. 9, similar portions to those in the first to third embodiments are denoted by similar reference numerals and their detailed description will be omitted. The fourth embodiment is different from the second embodiment except for a dummy area DMY. The dummy sense amplifier DSA is of differential amplification type as that in the third embodiment. The other structure of the fourth embodiment is the same as the structure of the second embodiment. In other words, the semiconductor memory is formed as an SRAM by a CMOS process on a silicon substrate. The SRAM is designed as a macro mounted on for example a system LSI or the like.

Figure 10:
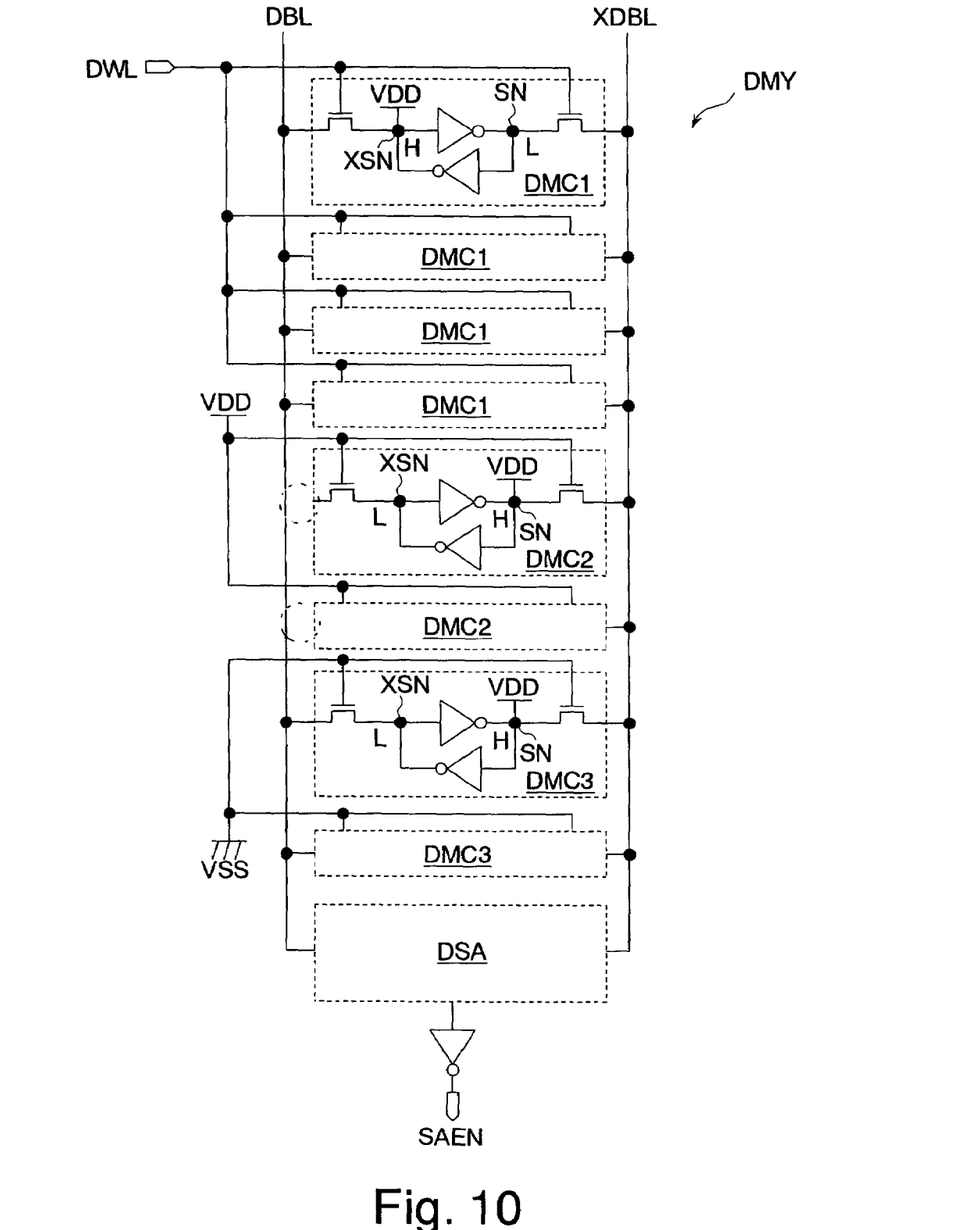
FIG. 10 is a circuit diagram showing details of a dummy area of the fourth embodiment.

FIG. 10 shows details of the dummy area DMY of the fourth embodiment. In each dummy memory cell DMC2 of the dummy area DMY, a first terminal of a transfer transistor is connected to a storage node XSN, while a second terminal thereof is not connected to a dummy bit line DBL, but open (denoted by a dotted circle in the drawing). Complementary dummy bit lines DBL and XDBL are connected to a dummy sense amplifier DSA. The other structure of the dummy area DMA of the fourth embodiment is the same as the structure of the dummy area DMA of the second embodiment (FIG. 5). The reading operation of the SRAM of the fourth embodiment is the same as that of the third embodiment (FIG. 8).

According to the fourth embodiment, the same effect as each of the first to third embodiments can be obtained.

When the present invention is applied to a clock synchronous type SRAM, the same effect as the foregoing effect can be obtained. In addition, when the present invention is applied to another semiconductor memory having memory cells each of which is composed of a latch that stores data and a transfer transistor that connects the latch to a bit line, the same effect as the foregoing effect can be obtained. This type of semiconductor memory is for example a nonvolatile SRAM of which a ferroelectric capacitor is connected to a storage node of each memory cell.

A structure having both the SRAM macro of the first embodiment and the SRAM macro of the second embodiment may be provided. In this case, according to the product specification and electric characteristic, one of the SRAM macros may be selected. Alternatively, a development tool for system LSIs may have a function for connecting each second dummy memory cell DMC2 to the dummy word line DWL or the power supply line VDD. As one of the connections is selected, the SRAM of the first embodiment or the SRAM of the second embodiment may be mounted on a system LSI. This technique can be applied to the third and fourth embodiments.

According to the foregoing embodiments, the present invention is applied to a clock synchronous type SRAM. However, the same effect can be applied when the present invention is applied to a clock asynchronous SRAM.

The invention is not limited to the above embodiments and various modifications may be made without departing from the spirit and scope of the invention. Any improvement may be made in part or all of the components.

What is claimed is:

1. A semiconductor memory, comprising:
   a plurality of real memory cells each of which has a real latch for storing write data and a transfer transistor connected to a storage node of the real latch;
   a real bit line connected to the real memory cells;
   a plurality of first dummy memory cells each of which has a first latch for storing a first logic and a transfer transistor connected to a storage node of the first latch;
   a plurality of second dummy memory cells each of which has a second latch for storing a second logic that is a reverse logic of the first logic and a transfer transistor connected to a storage node of the second latch;

a dummy word line connected to gates of the transfer transistors of the first and second dummy memory cells;

a dummy bit line connected to storage nodes of the first and second dummy memory cells through the transfer transistors;

a dummy sense amplifier activating a sense amplifier start signal when a voltage of the dummy bit line has reached a predetermined, value due to activation of the dummy word line; and a real sense amplifier amplifying a voltage on the real bit line in response to activation of the sense amplifier start signal.

2. The semiconductor memory as set forth in claim 1, further comprising a dummy precharging circuit precharging the dummy bit line in a high level, wherein:

the storage nodes of the first dummy memory cells are kept in a low level; and the storage nodes of the second dummy memory cells are kept in a high level.

3. The semiconductor memory as set forth in claim 1, further comprising:

a plurality of third dummy memory cells each of which has a third latch for storing the second logic and a transfer transistor connected to a storage node of the third latch, in which the storage node is connected to the dummy bit line through the transfer transistor and the transfer transistor is always turned off.

4. A semiconductor memory, comprising:

a plurality of real memory cells each of which has a real latch for storing write data and a transfer transistor connected to a storage node of the real latch;

a real bit line connected to the real memory cells;

a plurality of first dummy memory cells each of which has a first latch for storing a first logic and a transfer transistor connected to a storage node of the first latch;

a plurality of second dummy memory cells each of which has a second latch for storing a second logic that is a reverse logic of the first logic, and has a transfer transistor connected to a storage node of the second latch and always turned on;

a dummy word line connected to gates of the transfer transistors of the first dummy memory cells;

a dummy bit line connected to storage nodes of the first and second dummy memory cells through the transfer transistors;

a dummy sense amplifier activating a sense amplifier start signal when a voltage of the dummy bit line has reached a predetermined value due to activation of the dummy word line; and a real sense amplifier amplifying a voltage on the real bit line in response to activation of the sense amplifier start signal.

5. The semiconductor memory as set forth in claim 4, wherein:

the storage nodes of the first dummy memory cells are kept in a low level; and the storage nodes of the second dummy memory cells are kept in a high level.

6. The semiconductor memory as set forth in claim 4, further comprising:

a plurality of third dummy memory cells each of which has a third latch for storing the second logic and a transfer transistor connected to a storage node of the third latch, in which the storage node is connected to the dummy bit line through the transfer transistor and the transfer transistor is always turned off.

7. A semiconductor memory, comprising:

a plurality of real memory cells each of which has a real latch for storing write data and a pair of transfer transistors connected to complementary storage nodes of the real latch;

complementary real bit lines connected to the real memory cells;

a plurality of first dummy memory cells each of which has a first latch for storing a first logic and a pair of transfer transistors connected to complementary storage nodes of the first latch;

a plurality of second dummy memory cells each of which has a second latch for storing a second logic that is a reverse logic of the first logic and a pair of transfer transistors connected to complementary storage nodes of the second latch;

a dummy word line connected to gates of the transfer transistors of the first and second dummy memory cells;

complementary dummy bit lines connected to complementary storage nodes of the first dummy memory cells through the transfer transistors, respectively;

a dummy sense amplifier activating a sense amplifier start signal when a voltage difference between the complementary dummy bit lines has reached a predetermined value due to activation of the dummy word line; and a real sense amplifier differentially amplifying a voltage difference between the complementary real bit lines in response to activation of the sense amplifier start signal, wherein:

one of the complementary dummy bit lines is connected to one of the complimentary storage nodes of the second dummy memory cells through one of the transfer transistors; and the other of the complementary dummy bit lines is non-connected to the second dummy memory cells.

8. The semiconductor memory as set forth in claim 7, further comprising:

a dummy precharging circuit precharging the complementary dummy bit lines in a high level, wherein:

in each of the first dummy memory cells, the one of the complementary storage nodes corresponding to the one of complementary dummy bit lines is kept in a low level and the other of the complementary storage nodes corresponding to the other of complementary dummy bit lines is kept in a high level; and in each of the second dummy memory cells, the one of the complementary storage nodes corresponding to the one of complementary dummy bit lines is kept in a high level and the other of the complementary storage nodes corresponding to the other of complementary dummy bit lines is kept in a low level.

9. The semiconductor memory as set forth in claim 7, further comprising:

a plurality of third dummy memory cells each of which has a third latch connected to the complementary dummy bit lines for storing the second logic and has a pair of transfer transistors connected to complementary storage nodes of the third latch, respectively, and always turned off.

10. A semiconductor memory, comprising:

a plurality of real memory cells each of which has a real latch for storing write data and a pair of transfer transistors connected to complementary storage nodes of the real latch;

complementary real bit lines connected to the real memory cells;

a plurality of first dummy memory cells each of which has a first latch for storing a first logic and a pair of transfer transistors connected to complementary storage node of the first latch;

a plurality of second dummy memory cells each of which has a second latch for storing a second logic that is a reverse logic of the first logic and has a pair of transfer transistor connected to complementary storage nodes of the second latch and always turned on;

a dummy word line connected to gates of the transfer transistors of the first dummy memory cells;

complementary dummy bit lines connected to complementary storage nodes of the first dummy memory cells through the transfer transistors;

a dummy sense amplifier activating a sense amplifier start signal when a voltage difference between the complementary dummy bit lines has reached a predetermined value in response to activation of the dummy word line; and a real sense amplifier differentially amplifying a voltage difference between the complementary real bit lines in response to activation of the sense amplifier start signal, wherein:

one of the complementary dummy bit lines is connected to one of the complimentary storage nodes of the second dummy memory cells through one of the transfer transistors; and the other of the complementary dummy bit lines is non-connected to the second dummy memory cells.

11. The semiconductor memory as set forth in claim 10, wherein:

in each of the first dummy memory cells, the one of the complementary storage nodes corresponding to the one of complementary dummy bit lines is kept in a low level and the other of the complementary storage nodes corresponding to the other of complementary dummy bit lines is kept in a high level; and in each of the second dummy memory cells, the one of the complementary storage nodes corresponding to the one of complementary dummy bit lines is kept in a high level and the other of the complementary storage nodes corresponding to the other of complementary dummy bit lines is kept in a low level.

12. The semiconductor memory as set forth in claim 10, further comprising:

a plurality of third dummy memory cells each of which has a third latch connected to the complementary dummy bit lines for storing the second logic, and has a pair of transfer transistors connected to complementary storage nodes of the third latch, respectively, and always turned off.

* * * * *